United States Patent
Kim et al.

(10) Patent No.: US 10,014,435 B2
(45) Date of Patent: Jul. 3, 2018

(54) METHOD FOR MANUFACTURING METALLIC REFLECTOR FOR LED PACKAGE

(71) Applicant: FIRSTENG CO., LTD., Hwaseong-si, Gyeonggi-do (KR)

(72) Inventors: Yung Cheon Kim, Pyeongtaek-si (KR); Deok Hee Nam, Osan-si (KR); Min Chul Park, Osan-si (KR); Hae Chul Park, Incheon (KR); Baek Won Kang, Ansan-si (KR)

(73) Assignee: FIRSTENG CO., LTD., Hwaseong-si, Gyeonggi-Do (KR)

( * ) Notice: Subject to any disclaimer, the term of this patent is extended or adjusted under 35 U.S.C. 154(b) by 327 days.

(21) Appl. No.: 14/716,313

(22) Filed: May 19, 2015

(65) Prior Publication Data

US 2015/0340545 A1    Nov. 26, 2015

(30) Foreign Application Priority Data

May 22, 2014   (KR) ................. 10-2014-0061902

(51) Int. Cl.
*H01L 33/00* (2010.01)
*H01L 33/60* (2010.01)
(Continued)

(52) U.S. Cl.
CPC ............ *H01L 33/005* (2013.01); *H01L 33/60* (2013.01); *B21D 28/02* (2013.01); *B21D 28/32* (2013.01);
(Continued)

(58) Field of Classification Search
CPC ...... F21K 9/68; F21K 9/90; F21V 7/22; F21V 17/164; H01L 33/005; H01L 33/60;
(Continued)

(56) References Cited

U.S. PATENT DOCUMENTS

2011/0273892 A1* 11/2011 Mostoller ............... F21V 17/06
                                                    362/311.01
2012/0018762 A1*  1/2012 Abe ........................ H01L 33/62
                                                    257/98

(Continued)

OTHER PUBLICATIONS

Fechalos, Stephen; "Rack or Barrel Electroplating?"; Oct. 7, 2013; Asterion, LLC; https://www.asterionstc.com/2013/10/rack-barrel-electroplating/.*

*Primary Examiner* — Matthew P Travers
(74) *Attorney, Agent, or Firm* — Rabin & Berdo, P.C.

(57) ABSTRACT

A metallic reflector manufacturing method for an LED package. The method includes preparing a metal plate, and processing a stamping reflector that includes a lower body and an upper body that is extended from an upper side of the lower body and is integrally formed with the lower body. A reflection surface that is slanted by a predetermined angle is formed at a central portion of the upper body and the lower body to reflect the light of the LED chip to the outside. A fixation portion is formed to fix the lower body on a substrate that the LED chip is mounted on. The method further includes sequentially plating Ni and Ag on the reflection surface or the stamping reflector surface. The stamping processing includes a piercing step, a drawing step, a first noting step, a half etching step that forms the fixation portion, and a second notching step.

1 Claim, 10 Drawing Sheets

(51) Int. Cl.
  *B21D 35/00* (2006.01)
  *F21K 9/90* (2016.01)
  *F21K 9/68* (2016.01)
  *B21D 28/02* (2006.01)
  *B21D 28/32* (2006.01)

(52) U.S. Cl.
  CPC .............. *B21D 35/001* (2013.01); *F21K 9/68* (2016.08); *F21K 9/90* (2013.01); *H01L 2224/48091* (2013.01); *H01L 2224/48247* (2013.01); *H01L 2933/0025* (2013.01); *H01L 2933/0033* (2013.01); *H01L 2933/0058* (2013.01); *Y10T 29/49988* (2015.01)

(58) Field of Classification Search
  CPC . H01L 2224/48247; H01L 2224/48091; H01L 2933/0058; H01L 2933/0025; H01L 2933/0033; B21D 22/02; B21D 22/025; B21D 22/206; B21D 22/26; B21D 28/02; B21D 28/24; B21D 28/26; B21D 28/32; B21D 35/001
  USPC .............................................. 438/26, 28, 29
  See application file for complete search history.

(56) References Cited

U.S. PATENT DOCUMENTS

| | | | |
|---|---|---|---|
| 2012/0162998 A1* | 6/2012 | Takahashi | H01L 33/486 362/363 |
| 2012/0326634 A1* | 12/2012 | Li | H05B 33/0803 315/312 |
| 2015/0062915 A1* | 3/2015 | Hussell | F21V 7/22 362/296.01 |

* cited by examiner

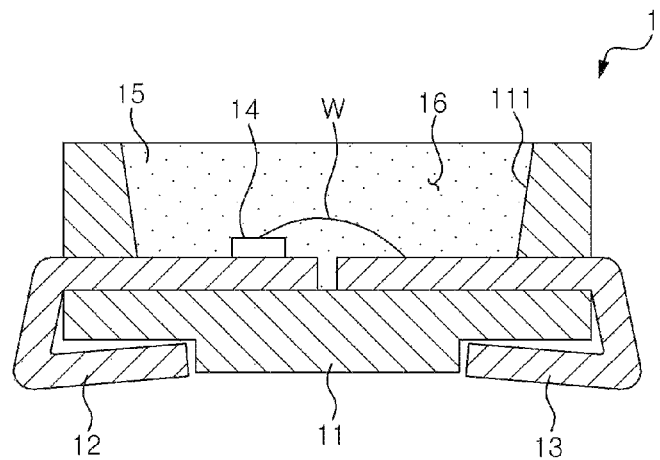
FIG. 1 [Prior Art]
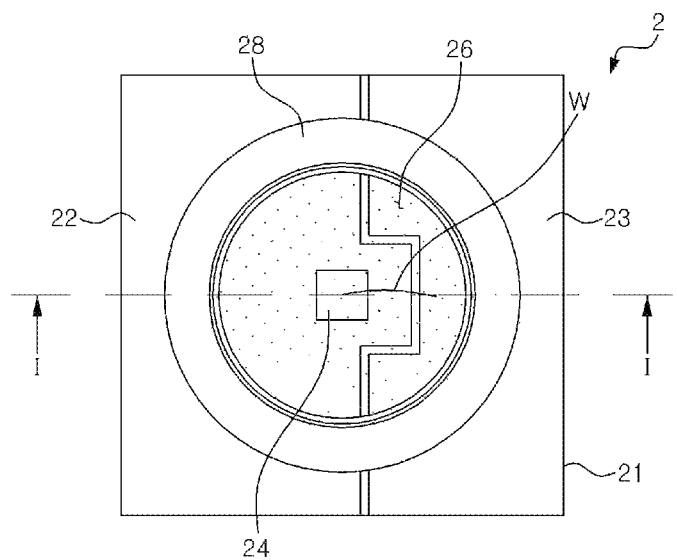
FIG. 2 [Prior Art]

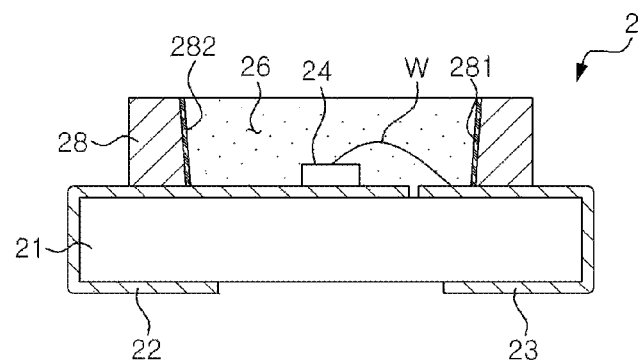
FIG. 3 [Prior Art]
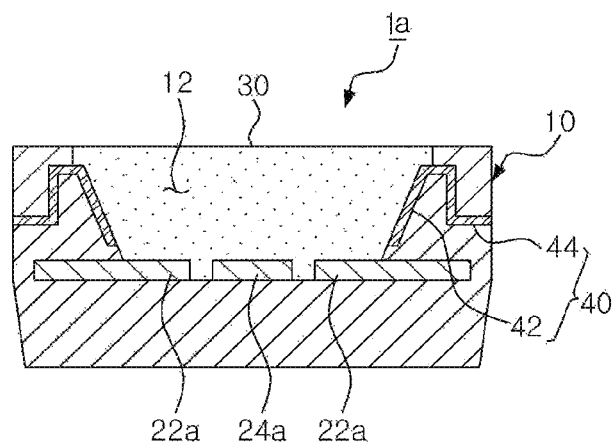
FIG. 4 [Prior Art]

METHOD FOR MANUFACTURING METALLIC REFLECTOR FOR LED PACKAGE

CROSS-REFERENCE TO RELATED APPLICATION

This application claims priority to and the benefit of Korean Patent Application No. 10-2014-0061902 filed in the Korean Intellectual Property Office on May 22, 2014, the entire contents of which are incorporated herein by reference.

BACKGROUND OF THE INVENTION (a) Field of the Invention

The present invention is related to a metallic reflector manufacturing method for an LED package. More particularly, the present invention relates to a metallic reflector manufacturing method for an LED package that the manufacturing process is very simple and the cost is cheap.

(b) Description of the Related Art

Generally, an LED (Light Emitting Diode) is an element that an electron meets hole to emit light in a P-N semiconductor junction, and the LED uses low voltage and current to enable continuous light emitting and has many merits such as low power consumption compared to other light source.

The LED is manufactured to have a general package structure, as shown in FIG. 1, the manufactured LED package 1 includes a first lid frame 12 and a second lid frame 13, and a package body 11 that is integrally formed with the first and the second lid frame 12 and 13.

Also, the package body 11 has an opening 15 that respectively exposes the first and the second lid frame 12 and 13, and an LED chip 14 is disposed on a bottom surface of the opening 15. An encapsulant 16 is charged in the opening 15 to close and seal the opening 15.

And, the LED chip 14 is bonded on the first lid frame 12 through conductive adhesive and is connected to the second lid frame 13 through a bonding wire (W). An inner wall 111 of the opening 15 has a predetermined slant surface such that the light emitted from the LED chip 14 is reflected to the outside.

However, because the inner wall 111 of the opening 15 includes a synthetic resin such as PPA, the color thereof is changed by the light and the heat that are emitted from the LED chip 14, the reflection rate is deteriorated, and therefore it is hard to realize desirable light efficiency.

A metallic reflector surrounding the LED chip is mounted on a substrate so as to resolve the problem such that the color change problem and the reflection deterioration that is caused by the heat and the light of the LED chip are improved by a Korean Patent Laid-Open Publication No. 10-2009-0103292.

A plane figure of the improved 'LED package' is shown in FIG. 2 and a sectional view that is cut along a line I-I of FIG. 2 is shown in FIG. 3.

Referring to FIG. 2 and to FIG. 3, the LED package 2 includes a substrate 21, and the substrate 21 has a pair of electrode pattern 22 and 23, and an LED chip 24 is disposed on an upper surface of the substrate 21.

Also, the LED chip 24 is connected to the other side electrode pattern 23 through a bonding wire (W) and is electrically connected to the pair of the electrode pattern 22 and 23.

And, the reflector is made of, for example, ring shape metallic material that is bonded by on the substrate 21 by adhesive.

A bottom surface of the reflector 28 can be bonded to the pair of electrode pattern 22 and 23 by insulation adhesive, and the inner wall of the reflector 28 has a predetermined slant surface to reflect the light that is emitted from the LED chip 24 to the outside.

And, a reflection layer 282 that is coated by a metal is formed on the inner wall 281, and the reflection layer 282 is formed by, for example, aluminization.

Also, an encapsulant 26 of light penetration type resin, for example, silicone resin, or epoxy resin is charged in the reflector 28 to close and seal the LED chip 24 that is disposed on the substrate 21.

The reflector 28 of metallic material that is applied to the LED package improves the color change problem and the reflection rate that are caused by the light and the heat of the LED chip 24.

However, when the reflection layer 282 of the metallic reflector 28 is formed by aluminization, the aluminization is direct performed on the metallic surface, and therefore the reflection layer 282 is lifted such that the reflection performance is deteriorated and the product quality is ruined.

Also, when a conventional reflector 28 is bonded on a substrate 21 by insulation adhesive, the adherence force is deteriorated by narrow area that the reflector 28 is bonded to the substrate 21 and the durability of the LED package is also deteriorated.

And, when the reflector 28 is combined by a screw, because the reflector 28 size is small, there is a problem that a screw cutting for the reflector 28 and the substrate is not easy.

An exemplary embodiment of a 'molding type LED package' that a reflector is molded by resin molding material to fix the reflector is shown in FIG. 4.

Referring to FIG. 4, a molding type LED package 1a includes a housing 10 that is formed by molding, for example, PPA resin, lid frame 22a and 24a having plurality of lids, an encapsulant 30 of light penetrating type that epoxy, silicone, or the mixture thereof is used to charge a cavity 12 space that an LED chip (not shown) is housed, and a reflector 40 that is made of metallic material and a reflection portion 42 and a heat radiating portion 44 are integrally formed.

A metallic reflector 40 having a heat radiating portion 44 is disposed on the said molding type LED package, and the heating radiating problem is resolved and simultaneously the reflector 40 can be fixed on the lid frame 22a and 24a.

However, because the reflector 40 is sealed by the housing 10 and the encapsulant 30, it is yet hard to radiate heat to the outside such that the performance, the durability, and the reliability of the LED package 1 are deteriorated.

And, a plating layer that is plated on a reflection surface of the reflection portion 42 can be lifted by high temperature heat.

Also, the metallic reflector 28 and 40 are manufactured by a die casting forming.

More specifically, first, for example, Zn material for making the reflector 28 and 40 are prepared, and the prepared material is melted in a melting furnace.

Thereafter, the melted material is injected into a die at high pressure, the forming is completed, the reflector product is drawn from the die casting mold, and a trimming process is performed.

The entire of the reflector product or the inner wall 281 and the reflection portion 42 is plated, and the plating process is performed as follows.

Firstly, foreign material or oil is eliminated from the reflector product that is formed by the conventional die casting forming, barrel polishing, chemical polishing, and Ag plating are sequentially performed, and oxidation prevention treatment is performed.

There is a merit that can manufacture complicated product in a die casting forming for the conventional metallic reflector 28 and 40.

However, the die casting forming needs an expensive facility due to metallic melted material, and also there is a problem that the die casting mold price is expensive.

And, because specific metal material that the melding point is low such as Mg, Zn, or Al can be applied to the die casting forming, a kind of metal is limited in manufacturing the metallic reflector.

Also, overall manufacturing process such as metal melting, and trimming process is difficult due to the die casting forming, and barrel polishing and chemical polishing have to be performed after the die casting forming.

And, because the conventional reflector is manufactured by the die casting forming, nonferrous metals such as Zn that the melting point is low has to be used, and therefore raw material cost is high, the process has to be mass production product, and there is a problem that the post processing is not easy.

Also, because the product that is manufactured by the die casting forming, the inside constitution of the metal is weak and there is a problem that the product is weak from the high temperature or an impact.

The above information disclosed in this background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a metallic reflector manufacturing method for an LED package having advantages of simplifying the manufacturing process and reducing the manufacturing cost.

For achieving the above objects, a metallic reflector manufacturing method for an LED package of the present invention that a reflection surface is formed to surround an LED chip that is disposed on a substrate at a predetermined height and has a predetermined slant angle to reflect the light of the LED chip to the outside may include (a) preparing a metal plate, (b) processing a stamping reflector that includes a lower body and an upper body that is extended from an upper side of the lower body and is integrally formed with the lower body, a reflection surface that is slanted by a predetermined angle is formed at a central portion of the upper body and the lower body to reflect the light of the LED chip to the outside, and is processed by a stamping process such that a fixation portion is formed to fix the lower body on a substrate that the LED chip is mounted on, (c) sequentially plating Ni and Ag on the reflection surface or the stamping reflector surface, wherein the stamping processing of the step (b), may include (b-1) a piercing step that pierces a base hole for each stage of the stamping process at an upper and lower edge of the metal plate in a length direction of the metal plate, (b-2) a drawing step that forming the reflection surface on the metal plate between the base holes, (b-3) a first noting step that eliminates a scrap from the metal plate, (b-4) a half etching step that forms the fixation portion, and (b-5) a second notching step that forms the opening. In accordance with an exemplary embodiment of the present invention, a fixation portion that can fix the metallic reflector is disposed on the reflector such that the performance and the durability of the LED package can be improved.

And, multi-layered plating is formed on the metallic reflector surface such that the lifting of the plating can be prevented and the reflection performance of the reflector can be maintained.

Also, because the metallic reflector can be manufactured by a stamping process, metallic melted liquid for a die casting forming is not necessary, and expensive facility and the die casting mold are not necessary.

And, because the reflector is manufactured by a stamping process, metal material can be variably selected, the manufacturing process becomes simple, and post processing such as plating can be easily performed.

Accordingly, the manufacturing cost for the metallic reflector can be remarkably reduced.

Also, the constitution inside the metal is improved during the manufacturing and the reflector becomes strong for the high temperature and the outside impact.

Accordingly, the performance, the durability, and the reliability of the LED package can be improved.

BRIEF DESCRIPTION OF THE DRAWINGS

FIG. 1 is a cross-sectional view of an LED package according to a conventional art.

FIG. 2 is a plane view of a conventional LED package that improves a conventional art of FIG. 1.

FIG. 3 is a cross-sectional view showing a section along line I-I of FIG. 2.

FIG. 4 is a cross-sectional view of a conventional molding type LED package that a reflector is molded by resin molding material to fix the reflector.

DETAILED DESCRIPTION OF THE EMBODIMENTS

Figure 5:
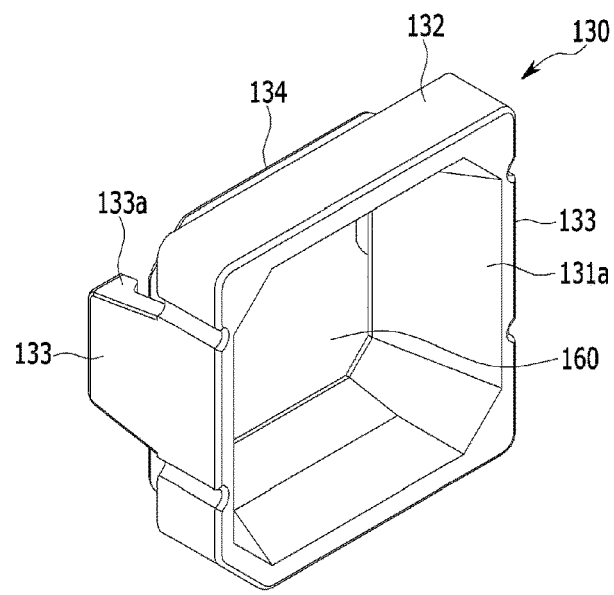
FIG. 5 is a front perspective view showing an exemplary embodiment of a metallic reflector that a metallic reflector manufacturing method for an LED package is applied thereto according to the present invention.

Hereinafter, referring to the drawings, a desirable exemplary embodiment will be described according to the present invention.

Figure 6:
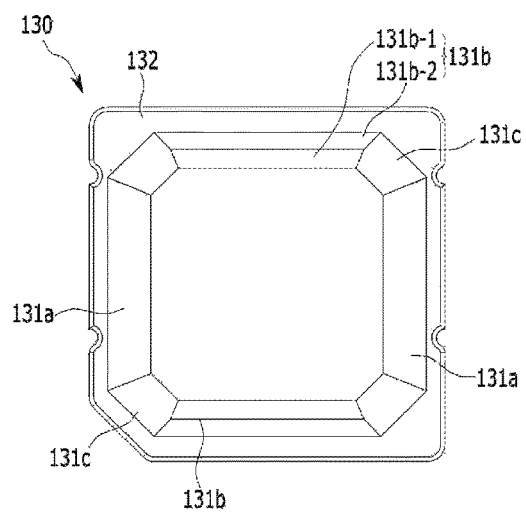
FIG. 6 is a front view of FIG. 5.
Figure 7:
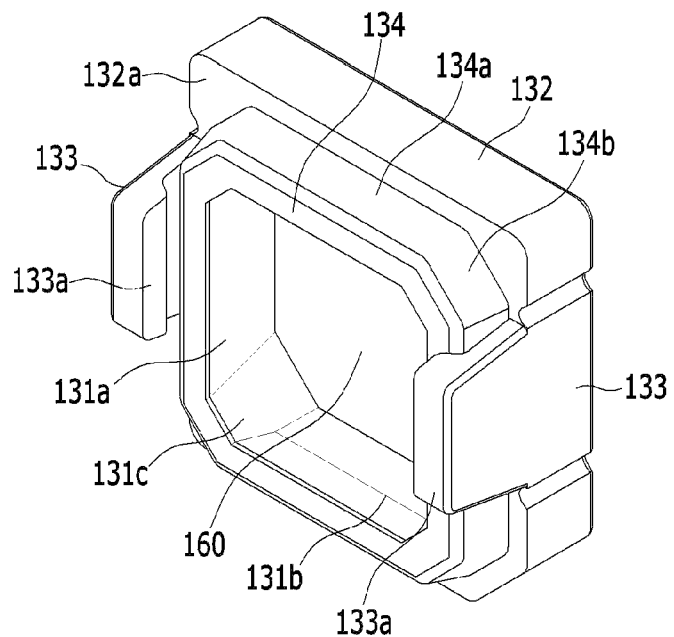
FIG. 7 is a rear perspective view of FIG. 5.

FIG. 5 is a front perspective view showing an exemplary embodiment of a metallic reflector that a metallic reflector manufacturing method for an LED package is applied thereto according to the present invention, and FIG. 6 is a front view of FIG. 5, and FIG. 7 is a rear perspective view of FIG. 5.

Figure 8:
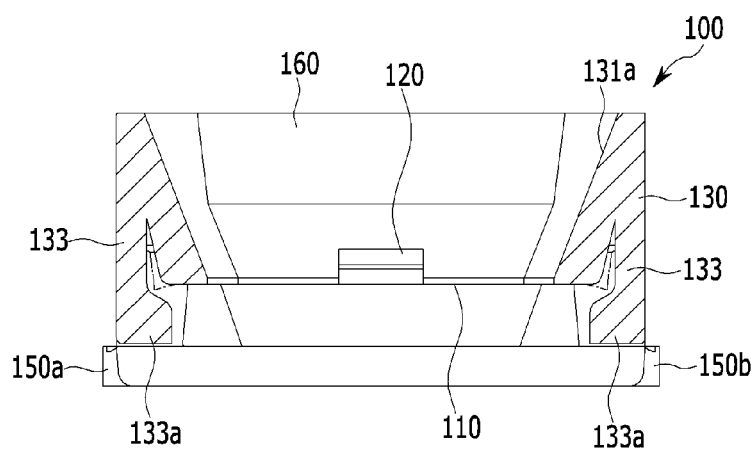
FIG. 8 is a cross-sectional view showing an LED package that a metallic reflector of FIG. 5 is applied thereto.

Also, a cross-sectional view showing an LED package that a metallic reflector of FIG. 5 is applied thereto is shown in FIG. 8.

Referring to FIG. 5 and FIG. 8, a metallic reflector 130 that a metallic reflector manufacturing method for an LED package is applied thereto according to the present invention includes a reflection surface that has a predetermined height to surround an LED chip 120 that is mounted on a substrate 110 and has a reflection surface that is slanted by a predetermined angle to reflect the light of the LED chip 120 to the outside.

More specifically, the metallic reflector 130 includes a lower body 134 that the lower surface thereof is bonded on a substrate 110, an upper body 132 that is extended from an upper portion of the lower body 134 and a catching projection 132a protrudes in a predetermined directions, and a catching portion 133 that faces each other at both sides of edges of the upper body 132 and a hook part 133a protrudes toward an inner side at a lower end portion such that a reflector 130 can be fixed on a substrate 110.

Also, as shown in FIG. 7, a lower body 134 of a lower portion of the catching projection 132a includes a taper 134a and 134b that becomes narrower as it goes to a lower side.

Accordingly, as shown in FIG. 5 and FIG. 8, a resin molding material is molded between an inner side (S) of the catching portion 133 and an outer side of the taper 134a and 134b of the lower body 134 of a lower side of the catching projection 132a such that a metallic reflector 130 is securely fixed on a substrate 110.

And, because a hook portion 133a is formed at the catching portion 133, the reflector 130 of metallic material can be further strongly fixed.

Also, because the outside of the upper body 132 and the catching portion 133 are exposed and is not molded by molding material, the heat radiation problem of an LED chip 120 is resolved.

And, a through hole 160 is formed at an inner surface of the lower body 134 and the upper body 132 such that the LED chip 120 of a substrate 110 is exposed outside the metallic reflector 130, and a reflection surface is formed on an interior circumference of the through hole 160.

The reflection surface includes four main reflection surfaces 131a and 131b of substantially quadrangle shape and sub reflection surface 131c that is formed at each edge of the main reflection surfaces 131a and 131b and has an area smaller than that of the main reflection surfaces.

And, two reflection surfaces that face each other of the main reflection surfaces 131a and 131b has a slant angle increment surface 131b that the slant angle thereof is increased in a predetermined height.

It is desirable that the slant angle increment surface 131b is formed at a surface that intersects in rectangular with the catching portion 133 during a stamping processing.

As described above, because the sub reflection surface 131c is formed between the main reflection surfaces 131a and 131b, a reflection blind spot of a conventional rectangular edge is eliminated such that the reflection efficiency of the LED chip 120 can be improved.

Also, the slant angle increment surface 131b is formed on the main reflection surfaces 131a and 131b of front and rear or left and right of the said reflections, for example, in a case that a shape (rectangle) or a mounting position of the LED chip 120 is changed, it deals with a case that the main reflection surfaces 131a and 131b are formed with an equal width.

Accordingly, it can be dealt in accordance with the shape and the mounting position of the LED chip 120 such that the reflection efficiency is not deteriorated.

Meanwhile, reference numerals 150a and 150b that are not described in FIG. 8 denotes a terminal lid.

And, in a case that the LED chip 120 is bonded by a wire, an inside hole (through hole 160) of the reflection surface is charged with an encapsulant (not shown).

Figure 9:
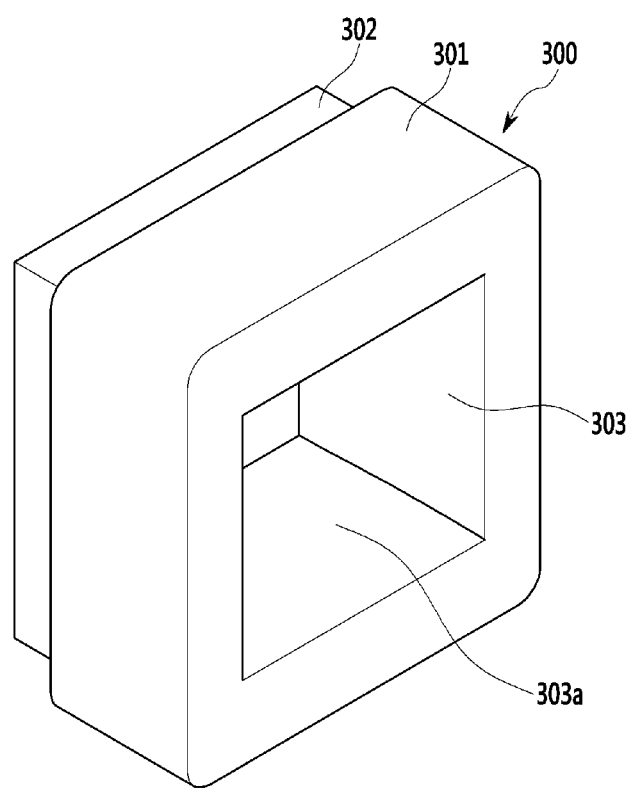
FIG. 9 is a front perspective view showing another exemplary embodiment of a metallic reflector that a metallic reflector manufacturing method for an LED package is applied thereto according to the present invention.
Figure 10:
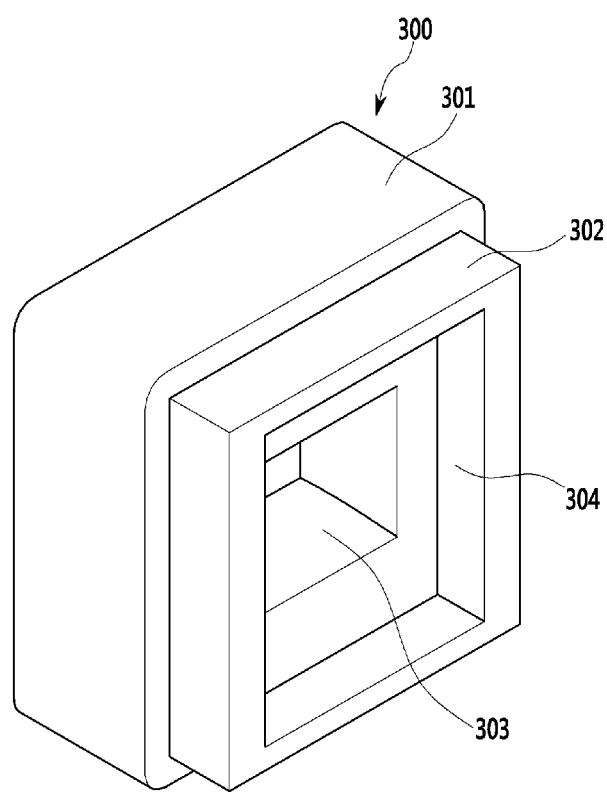
FIG. 10 is a rear perspective view of FIG. 11.
Figure 11:
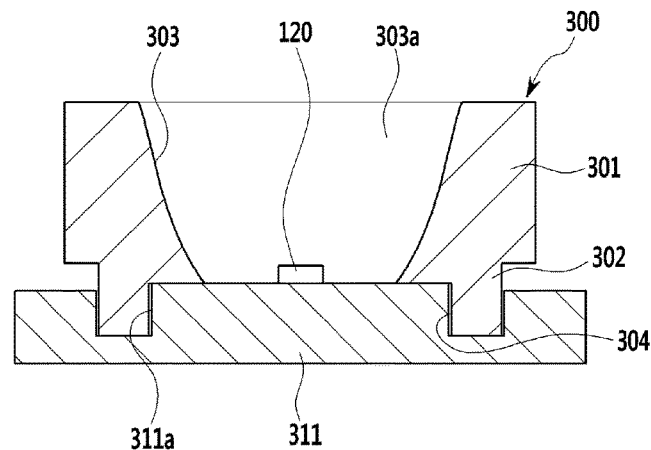
FIG. 11 is a cross-sectional view showing an LED package that a metallic reflector is applied thereto of FIG. 9.

A front perspective view of another exemplary embodiment of a metallic reflector that a metallic reflector manufacturing method for an LED package is applied thereto is shown in FIG. 9 according to the present invention, and a rear perspective view of FIG. 11 is shown in a FIG. 10.

And, a cross sectional view showing an LED package that a metallic reflector of FIG. 9 is applied thereto is shown in FIG. 11.

Referring to FIG. 9 to FIG. 11, the metallic reflector 300 that the metallic reflector manufacturing method for an LED package is applied thereto according to the present invention includes an upper body 301 and a lower body 302 that is extended in a lower portion of the upper body 301 and is integrally formed with the upper body 301.

And, as shown in FIG. 11, because a first opening 303a, which a reflection surface 303 having a predetermined angle is formed, is formed at a central portion of the upper body 301 and the lower body 302, the light of the LED chip 120 that is disposed on the substrate 304 is reflected by the reflection surface 303 outside the metallic reflector 300.

Particularly, a second opening 304 is formed inside a lower end portion of the lower body 302, and the lower body 302 is fixedly inserted into an insertion hole 311a of the substrate 311. That is, the lower body 134 and 302 of the metallic reflector 130 according to an exemplary embodiment of FIG. 5 or a metallic reflector 300 according to an exemplary embodiment of FIG. 9 function as a fixation portion that is fixed on the substrate 110 and 304.

Accordingly, because the metallic reflector 130 and 300 according to the present invention is fixed on the substrate 110 and 304, the bonding strength of them is not less than that of the adhesive, the assembly of them is easy, and the structure of the metallic reflector 130 and 300 is reinforced.

Besides, because of a fixation structure of the lower body of the metallic reflector according to the present invention, most of the part of the outer surface of the upper body can be exposed to the atmosphere, and as described in FIG. 4, there is no need to seal all of the reflector 40 by the housing 10 and the encapsulant 30.

Accordingly, it is advantageous to radiate the heat of the LED chip 120 to the outside, and the performance, the durability, and the reliability of the LED package can be improved.

The metallic reflector manufacturing method for an LED package according to the present invention having the above structure will be described.

Figure 12:
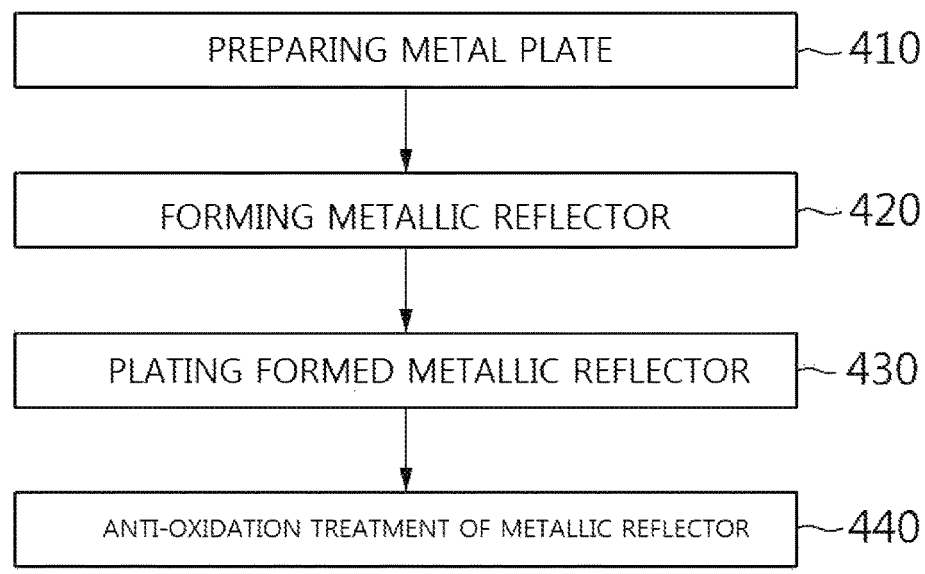
FIG. 12 is a schematic flowchart sequentially showing a metallic reflector manufacturing method for an LED package according to the present invention.

A schematic flowchart sequentially shows a metallic reflector manufacturing method for an LED package according to the present invention in FIG. 12.

Figure 13:
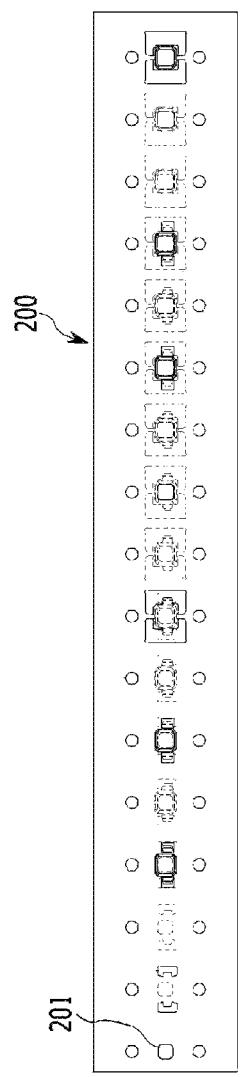
FIG. 13 is a plane view of a metal plate that a metallic reflector manufacturing method for an LED package according to the present invention.

A metallic reflector manufacturing method for an LED package according to the present invention, as shown in FIG. 13, a metal plate (e.g., Cu plate) 200 having a predetermined width, length, and thickness is prepared (step 410). Subsequently, the metallic reflector 130 of FIG. 5 or FIG. 9 is formed by a stamping process (Step 420).

That is, a reflector product 130a is formed by a stamping process, wherein the reflector product 130a includes a lower body 134 and 302 and an upper body 132 and 301 that is extended from an upper side of the lower body 134 and 302 and is integrally formed with the lower body 134 and 302, reflection surfaces 131a, 131c, 303 that are slanted at a predetermined angle is formed at a central portion of the upper body 132 and 301 and the lower body 134 and 302 to reflect the light of the LED chip 120 to the outside, openings 160 and 303a are formed at a lower portion of the reflection 131a, 131c, 303 to expose the LED chip 120, and a fixation portion is formed to fix the lower body 134 and 302 on the substrate 110 and 304 that the LED chip 120 is mounted.

Subsequently, Ni plating is formed on the surface of the refection surface 131a, 131c, 303 or the reflector product 130a, and Ag plating is sequentially performed (Step 430).

Meanwhile, before the Ni plating is performed, Cu strike plating of a thin film (1-2 μm) can be formed on the surface of the refection surface 131a, 131c, 303 or the reflector product 130a within in a short time so as to improve the plating reliability.

Accordingly, the metallic reflector 130 and 300 for the LED package according to the present invention is plated at least twice such that the lifting phenomenon of the surface plating layer of the reflection surface 131a, 131c, 303 or the reflector product 130a can be prevented.

Also, an oxidation process or a color change prevention process is performed on the surface of the reflector product 130a that is plated as described above (step 440).

Meanwhile, as described above, because a conventional metallic reflector is formed by a die casting forming, a trimming process has to be performed after the die casting forming.

Accordingly, a manufacturing process of the metallic reflector 130 according the present invention is simple compared to a conventional process without the trimming process.

And, the metal plate 200 can use Zn or Al besides Cu plate.

However, the metal plate 200 can include Fe, Al, or Au besides the above element.

On the other hand, a stamping process of the step 420 will be described in more detail. Hereinafter, a metallic reflector according to an exemplary embodiment of FIG. 5 will be described as an example.

Firstly, as shown in FIG. 13, a piercing (step 420a) is performed, wherein a base hole 201 for each course of a stamping process is formed at an upper and a lower edge of a metal plate in a length direction of the metal plate 200 by a piercing punch (not shown).

Figure 14:
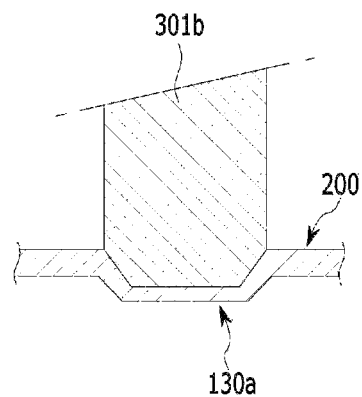
FIG. 14 to FIG. 17 is a processing flowchart showing a stamping processing in a metal plate of FIG. 13.

Subsequently, as shown in FIG. 14, a drawing punch 301b of a stamping mold is used to perform a drawing (step 420b) that forms a reflection surface 131a and 131c on the metal plate 200 between the base holes 201.

In the 420b step, a step portion is formed outside the lower body 134 and the upper body 132 to distinguish the lower body 134 and the upper body 132.

And, a first notch punch (not shown) of the stamping mold is used to perform a first notching (step 420c) to eliminate a scrap from the metal plate.

Figure 15:
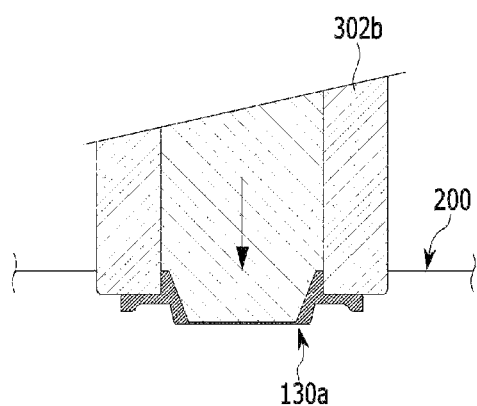

Also, as shown in FIG. 15, a half etching punch 302b of a stamping mold is used to perform a half etching (step 420d) to form a fixation portion or a catching portion 133 such as the lower body 134.

Figure 16:
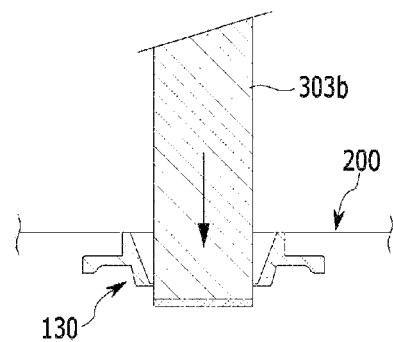

Subsequently, as shown in FIG. 16, a second notching punch 303b of a stamping mold is used to perform a second notching (step 420e) to form an opening 160.

Figure 17:
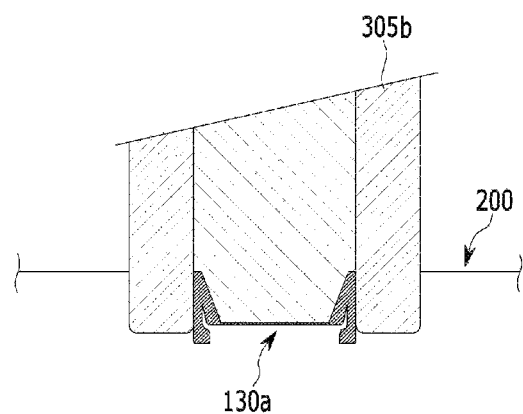

And, in a case that the catching portion 133 is formed to fix the reflector product 130a on the substrate 110 in the stamping process, as shown in FIG. 17, a bending punch 350b of the stamping mold is used to perform a bending to form a catching portion 133.

And, after the step 420e, a cutting punch 306b of a stamping mold is used to perform a cutting (step 420f) to eliminate unnecessary parts from the reflector product or to drop the reflector product 130a from the metal plate 200.

Also, in the step 430, the Ni plating and the Ag plating can be formed by one of a rack plating and a barrel plating. That is, the plating that is performed in a metallic reflector manufacturing method for a led package according to the present invention can be a rack plating that plates the metal plate 200 that the reflector product 130a is formed as shown in FIG. 13 or can be a barrel plating that aggregates the reflector products to plate them after the cutting process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

100. LED package
110,304. substrate
120. LED chip
130,300. metallic reflector
131a,131b. main reflection surface
131c. sub reflection surface
132,301. upper body
132a. catching projection
133. catching portion
134,302. Lower body

What is claimed is:
1. A method of manufacturing a metallic reflector having a reflection surface formed to surround an LED chip that is disposed on a substrate at a predetermined height and having a predetermined slant angle to reflect the light of the LED chip to the outside, the method comprising:
(a) preparing a metal plate;
(b) processing, by stamping, a stamping reflector that includes
a lower body and an upper body that is extended from an upper side of the lower body and is integrally formed with the lower body,
a reflection surface that is slanted by a predetermined angle formed at a central portion of the upper body and the lower body to reflect the light of the LED chip to the outside, and
a fixation portion to fix the lower body on the substrate that the LED chip is mounted on; and
(c) sequentially plating Ni and Ag on the reflection surface or the stamping reflector surface;
wherein the stamping processing of step (b), comprises:
(b-1) piercing a base hole for each stage of the stamping process at an upper and lower edge of the metal plate in a length direction of the metal plate;
(b-2) draw forming the reflection surface on the metal plate between the base holes;
(b-3) eliminating scrap from the metal plate by a first notching step;
(b-4) forming the fixation portion by a half etching step;

(b-5) forming an opening by a second notching step, wherein the opening is a through hole defined by and surrounded by the lower body, such that the LED chip and the substrate are exposed to the outside through the opening while the lower body is disposed on the substrate on which the LED chip is disposed, wherein the method further comprises:

forming, by a bending step, a catching portion, which fixes the stamping reflector on the substrate, during the stamping process; and eliminating, by a cutting step, unnecessary parts from the stamping reflector, after step (b-5), wherein a step portion is formed outside the lower body and the upper body to distinguish the lower body and the upper body in step (b-2), wherein the metal plate includes a Cu plate, and wherein the catching portion is formed to include a hook part which protrudes towards an inner side of the stamping reflector.

\* \* \* \* \*